(12) United States Patent
Park et al.

(10) Patent No.: US 10,979,073 B2
(45) Date of Patent: Apr. 13, 2021

(54) LOW DENSITY PARITY CHECK ENCODER HAVING LENGTH OF 64800 AND CODE RATE OF 7/15, AND LOW DENSITY PARITY CHECK ENCODING METHOD USING THE SAME

(71) Applicant: ELECTRONICS AND TELECOMMUNICATIONS RESEARCH INSTITUTE, Daejeon (KR)

(72) Inventors: Sung-Ik Park, Daejeon (KR); Heung-Mook Kim, Daejeon (KR); Sun-Hyoung Kwon, Daejeon (KR); Nam-Ho Hur, Sejong (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 16/543,349

(22) Filed: Aug. 16, 2019

(65) Prior Publication Data

US 2019/0372595 A1    Dec. 5, 2019

Related U.S. Application Data

(63) Continuation of application No. 15/641,060, filed on Jul. 3, 2017, now Pat. No. 10,432,220, which is a (Continued)

(30) Foreign Application Priority Data

Oct. 7, 2013    (KR) .................. 10-2013-0119514
Oct. 10, 2013   (KR) .................. 10-2013-0120573
(Continued)

(51) Int. Cl.
*H03M 13/11*    (2006.01)
*H03M 13/00*    (2006.01)

(52) U.S. Cl.
CPC .... *H03M 13/1157* (2013.01); *H03M 13/1165* (2013.01); *H03M 13/1177* (2013.01); *H03M 13/616* (2013.01); *H03M 13/618* (2013.01)

(58) Field of Classification Search
CPC .................................................. H03M 13/1157
See application file for complete search history.

(56) References Cited

U.S. PATENT DOCUMENTS

2008/0178065 A1    7/2008   Khandekar et al.
2011/0283158 A1   11/2011   Yang et al.
(Continued)

FOREIGN PATENT DOCUMENTS

EP       2178217 A2      4/2010
KR    20070058438 A      6/2007
(Continued)

OTHER PUBLICATIONS

"Digital Video Broadcasting (DVB): Next Generation broadcasting system to Handheld, physical layer specification (DVB-NGH)." DVB document A160, 2012, pp. 1-295.
(Continued)

*Primary Examiner* — Joseph D Torres

(57) ABSTRACT

A low density parity check (LDPC) encoder, an LDPC decoder, and an LDPC encoding method are disclosed. The LDPC encoder includes first memory, second memory, and a processor. The first memory stores an LDPC codeword having a length of 64800 and a code rate of 7/15. The second memory is initialized to 0. The processor generates the LDPC codeword corresponding to information bits by performing accumulation with respect to the second memory using a sequence corresponding to a parity check matrix (PCM).

6 Claims, 5 Drawing Sheets

Related U.S. Application Data continuation of application No. 15/234,531, filed on Aug. 11, 2016, now Pat. No. 9,729,172, which is a continuation of application No. 14/496,700, filed on Sep. 25, 2014, now Pat. No. 9,450,611.

(30) Foreign Application Priority Data

Dec. 3, 2013 (KR) .......................... 10-2013-0149478
Sep. 11, 2014 (KR) .......................... 10-2014-0120015

(56) References Cited

U.S. PATENT DOCUMENTS

2013/0254617 A1 9/2013 Shinohara et al.
2013/0290816 A1* 10/2013 Shinohara ............. H03M 13/13
                                                                      714/776
2013/0297992 A1* 11/2013 Yamamoto ........ H03M 13/2906
                                                                      714/776
2014/0157079 A1 6/2014 Park et al.

FOREIGN PATENT DOCUMENTS

| KR | 20130135746 A | 12/2013 |
|----|---------------|---------|
| WO | WO2006001666 A2 | 1/2006 |

OTHER PUBLICATIONS

Digital Video Broadcasting (DVB); Frame Structure Channel Coding and Modulation for a Second Generation Digital Terrestrial Television Broadcasting System (DVB-T2), ETSI EN 302 755 V1.2.1, 2010, pp. 177.
Wu, et al., "Cloud Transmission: A New Spectrum-Reuse Friendly Digital Terrestrial Broadcasting Transmission System," IEEE Transactions on Broadcasting, 2012, vol. 58 (3), pp. 329-337.

* cited by examiner

LOW DENSITY PARITY CHECK ENCODER HAVING LENGTH OF 64800 AND CODE RATE OF 7/15, AND LOW DENSITY PARITY CHECK ENCODING METHOD USING THE SAME

CROSS-REFERENCE TO RELATED APPLICATIONS

This application is a continuation of U.S. patent application Ser. No. 15/641,060, filed Jul. 3, 2017, which is a continuation of U.S. patent application Ser. No. 15/234,531 filed Aug. 11, 2016, now U.S. Pat. No. 9,729,172, which is a continuation of U.S. patent application Ser. No. 14/496,700, filed Sep. 25, 2014, now U.S. Pat. No. 9,450,611, which claims the benefit of Korean Patent Application Nos. 10-2013-0119514, 10-2013-0120573, 10-2013-0149478 and 10-2014-0120015, filed Oct. 7, 2013, Oct. 10, 2013, Dec. 3, 2013 and Sep. 11, 2014, respectively, which are hereby incorporated by reference herein in their entirety.

BACKGROUND

1. Technical Field

The present disclosure relates generally to a low density parity check (LDPC) code that is used to correct errors occurring over a wireless channel, and, more particularly, to an LDPC code that is applicable to a digital broadcasting system.

2. Description of the Related Art

Current terrestrial television (TV) broadcasting generates co-channel interference across an area within a distance that is three times a service radius, and thus the same frequency cannot be reused in the area within the distance that is three times the service radius. An area in which the same frequency cannot be reused is called a white space. Spectrum efficiency significantly deteriorates due to the occurrence of a white space.

Accordingly, there arises a need for the development of a transmission technology that facilitates the elimination of a white space and the reuse of a frequency with an emphasis on reception robustness in order to improve spectrum efficiency.

In response to this, the paper "Cloud Transmission: A New Spectrum-Reuse Friendly Digital Terrestrial Broadcasting Transmission System" published on September of 2012 in IEEE Transactions on Broadcasting, Vol. 58, No. 3 proposes a terrestrial cloud transmission technology that facilitates reuse, does not generate a white space, and makes the construction and operation of a single frequency network easy.

Using this terrestrial cloud transmission technology, a broadcasting station can transmit the same nationwide content or locally different content over a single broadcasting channel. However, for this purpose, a receiver should receive one or more terrestrial cloud broadcast signals in an area in which signals transmitted from different transmitters overlap each other, that is, an overlap area, over a single frequency network, and then should distinguish and demodulate the received terrestrial cloud broadcast signals. That is, the receiver should demodulate one or more cloud broadcast signals in a situation in which co-channel interference is present and the timing and frequency synchronization between transmitted signals are not guaranteed.

Meanwhile, Korean Patent Application Publication No. 2013-0135746 entitled "Low Density Parity Check Code for Terrestrial Cloud Transmission" discloses an LDPC code that is optimized for terrestrial cloud transmission and exhibits excellent performance at low code rate (<0.5).

However, Korean Patent Application Publication No. 2013-0135746 is directed to a code length completely different from an LDPC code length used in the DVB broadcast standard, etc., and does not teach a specific LDPC encoding method.

SUMMARY

At least one embodiment of the present invention is directed to the provision of a new LDPC codeword having a length of 64800 and a code rate of 7/15, which is capable of being used for general purposes.

At least one embodiment of the present invention is directed to the provision of an LDPC encoding technique that is capable of efficiently performing LDPC encoding using a sequence having a number of rows equal to a value that is obtained by dividing the sum of the length of the systematic part of an LDPC codeword, that is, 30240, and the length of the first parity part of the LDPC codeword, that is, 1080, by 360.

In accordance with an aspect of the present invention, there is provided an LDPC encoder, including first memory configured to store an LDPC codeword having a length of 64800 and a code rate of 7/15; second memory configured to be initialized to 0; and a processor configured to generate the LDPC codeword corresponding to information bits by performing accumulation with respect to the second memory using a sequence corresponding to a parity check matrix (PCM).

The accumulation may be performed at parity bit addresses that are updated using the sequence corresponding to the PCM.

The LDPC codeword may include a systematic part corresponding to the information bits and having a length of 30240, a first parity part corresponding to a dual diagonal matrix included in the PCM and having a length of 1080, and a second parity part corresponding to an identity matrix included in the PCM and having a length of 33480.

The sequence may have a number of rows equal to the sum of a value obtained by dividing a length of the systematic part, that is, 30240, by a circulant permutation matrix (CPM) size corresponding to the PCM, that is, 360, and a value obtained by dividing a length of the first parity part, that is, 1080, by the CPM size.

The sequence may be represented by the following Sequence Table:

Sequence Table

| | |
|---|---|
| 1st row: | 460 792 1007 4580 11452 13130 26882 27020 32439 |
| 2nd row: | 35 472 1056 7154 12700 13326 13414 16828 19102 |
| 3rd row: | 45 440 772 4854 7863 26945 27684 28651 31875 |
| 4th row: | 744 812 892 1509 9018 12925 14140 21357 25106 |
| 5th row: | 271 474 761 4268 6706 9609 19701 19707 24870 |
| 6th row: | 223 477 662 1987 9247 18376 22148 24948 27694 |
| 7th row: | 44 379 786 8823 12322 14666 16377 28688 29924 |
| 8th row: | 104 219 562 5832 19665 20615 21043 22759 32180 |
| 9th row: | 41 43 870 7963 13718 14136 17216 30470 33428 |
| 10th row: | 592 744 887 4513 6192 18116 19482 25032 34095 |
| 11th row: | 456 821 1078 7162 7443 8774 15567 17243 33085 |
| 12th row: | 151 666 977 6946 10358 11172 18129 19777 32234 |
| 13th row: | 236 793 870 2001 6805 9047 13877 30131 34252 |
| 14th row: | 297 698 772 3449 4204 11608 22950 26071 27512 |

-continued

Sequence Table

| | |
|---|---|
| 15th row: | 202 428 474 3205 3726 6223 7708 20214 25283 |
| 16th row: | 139 719 915 1447 2938 11864 15932 21748 28598 |
| 17th row: | 135 853 902 3239 18590 20579 30578 33374 34045 |
| 18th row: | 9 13 971 11834 13642 17628 21669 24741 30965 |
| 19th row: | 344 531 730 1880 16895 17587 21901 28620 31957 |
| 20th row: | 7 192 380 3168 3729 5518 6827 20372 34168 |
| 21st row: | 28 521 681 4313 7465 14209 21501 23364 25980 |
| 22nd row: | 269 393 898 3561 11066 11985 17311 26127 30309 |
| 23rd row: | 42 82 707 4880 4890 9818 23340 25959 31695 |
| 24th row: | 189 262 707 6573 14082 22259 24230 24390 24664 |
| 25th row: | 383 568 573 5498 13449 13990 16904 22629 34203 |
| 26th row: | 585 596 820 2440 2488 21956 28261 28703 29591 |
| 27th row: | 755 763 795 5636 16433 21714 23452 31150 34545 |
| 28th row: | 23 343 669 1159 3507 13096 17978 24241 34321 |
| 29th row: | 316 384 944 4872 8491 18913 21085 23198 24798 |
| 30th row: | 64 314 765 3706 7136 8634 14227 17127 23437 |
| 31st row: | 220 693 899 8791 12417 13487 18335 22126 27428 |
| 32nd row: | 285 794 1045 8624 8801 9547 19167 21894 32657 |
| 33rd row: | 386 621 1045 1634 1882 3172 13686 16027 22448 |
| 34th row: | 95 622 693 2827 7098 11452 14112 18831 31308 |
| 35th row: | 446 813 928 7976 8935 13146 27117 27766 33111 |
| 36th row: | 89 138 241 3218 9283 20458 31484 31538 34216 |
| 37th row: | 277 420 704 9281 12576 12788 14496 15357 20585 |
| 38th row: | 141 643 758 4894 10264 15144 16357 22478 26461 |
| 39th row: | 17 108 160 13183 15424 17939 19276 23714 26655 |
| 40th row: | 109 285 608 1682 20223 21791 24615 29622 31983 |
| 41st row: | 123 515 622 7037 13946 15292 15606 16262 23742 |
| 42nd row: | 264 565 923 6460 13622 13934 23181 25475 26134 |
| 43rd row: | 202 548 789 8003 10993 12478 16051 25114 27579 |
| 44th row: | 121 450 575 5972 10062 18693 21852 23874 28031 |
| 45th row: | 507 560 889 12064 13316 19629 21547 25461 28732 |
| 46th row: | 664 786 1043 9137 9294 10163 23389 31436 34297 |
| 47th row: | 45 830 907 10730 16541 21232 30354 30605 31847 |
| 48th row: | 203 507 1060 6971 12216 13321 17861 22671 29825 |
| 49th row: | 369 881 952 3035 12279 12775 17682 17805 34281 |
| 50th row: | 683 709 1032 3787 17623 24138 26775 31432 33626 |
| 51st row: | 524 792 1042 12249 14765 18601 25811 32422 33163 |
| 52nd row: | 137 639 688 7182 8169 10443 22530 24597 29039 |
| 53rd row: | 159 643 749 16386 17401 24135 28429 33468 33469 |
| 54th row: | 107 481 555 7322 13234 19344 23498 26581 31378 |
| 55th row: | 249 389 523 3421 10150 17616 19085 20545 32069 |
| 56th row: | 395 738 1045 2415 3005 3820 19541 23543 31068 |
| 57th row: | 27 293 703 1717 3460 8326 8501 10290 32625 |
| 58th row: | 126 247 515 6031 9549 10643 22067 29490 34450 |
| 59th row: | 331 471 1007 3020 3922 7580 23358 28620 30946 |
| 60th row: | 222 542 1021 3291 3652 13130 16349 33009 34348 |
| 61st row: | 532 719 1038 5891 7528 23252 25472 31395 31774 |
| 62nd row: | 145 398 774 7816 13887 14936 23708 31712 33160 |
| 63rd row: | 88 536 600 1239 1887 12195 13782 16726 27998 |
| 64th row: | 151 269 585 1445 3178 3970 15568 20358 21051 |
| 65th row: | 650 819 865 15567 18546 25571 32038 33350 33620 |
| 66th row: | 93 469 800 6059 10405 12296 17515 21354 22231 |
| 67th row: | 97 206 951 6161 16376 27022 29192 30190 30665 |
| 68th row: | 412 549 986 5833 10583 10766 24946 28878 31937 |
| 69th row: | 72 604 659 5267 12227 21714 32120 33472 33974 |
| 70th row: | 25 902 912 1137 2975 9642 11598 25919 28278 |
| 71st row: | 420 976 1055 8473 11512 20198 21662 25443 30119 |
| 72nd row: | 1 24 932 6426 11899 13217 13935 16548 29737 |
| 73rd row: | 53 618 988 6280 7267 11676 13575 15532 25787 |
| 74th row: | 111 739 809 8133 12717 12741 20253 20608 27850 |
| 75th row: | 120 683 943 14496 15162 15440 18660 27543 32404 |
| 76th row: | 600 754 1055 7873 9679 17351 27268 33508 |
| 77th row: | 344 756 1054 7102 7193 22903 24720 27883 |
| 78th row: | 582 1003 1046 11344 23756 27497 27977 32853 |
| 79th row: | 28 429 509 11106 11767 12729 13100 31792 |
| 80th row: | 131 555 907 5113 10259 10300 20580 23029 |
| 81st row: | 406 915 977 12244 20259 26616 27899 32228 |
| 82nd row: | 46 195 224 1229 4116 10263 13608 17830 |
| 83rd row: | 19 819 953 7965 9998 13959 30580 30754 |
| 84th row: | 164 1003 1032 12920 15975 16582 22624 27357 |
| 85th row: | 8433 11894 13531 17675 25889 31384 |
| 86th row: | 3166 3813 8596 10368 25104 29584 |
| 87th row: | 2466 8241 12424 13376 24837 32711 |

The accumulation may be performed while the rows of the sequence are being repeatedly changed by the CPM size of the PCM.

In accordance with an aspect of the present invention, there is provided an LDPC encoding method, including initializing first memory configured to store an LDPC codeword having a length of 64800 and a code rate of 7/15 and second memory; and generating the LDPC codeword corresponding to information bits by performing accumulation with respect to the second memory using a sequence corresponding to a PCM.

The accumulation may be performed at parity bit addresses that are updated using the sequence corresponding to the PCM.

The LDPC codeword may include a systematic part corresponding to the information bits and having a length of 30240, a first parity part corresponding to a dual diagonal matrix included in the PCM and having a length of 1080, and a second parity part corresponding to an identity matrix included in the PCM and having a length of 33480.

The sequence may have a number of rows equal to the sum of a value obtained by dividing a length of the systematic part, that is, 30240, by a circulant permutation matrix (CPM) size corresponding to the PCM, that is, 360, and a value obtained by dividing a length of the first parity part, that is, 1080, by the CPM size.

The sequence may be represented by the above Sequence Table.

In accordance with still another aspect of the present invention, there is provided an LDPC decoder, including a receiving unit configured to receive an LDPC codeword encoded using a sequence corresponding to a PCM and is represented by the above Sequence Table; and a decoding unit configured to restore information bits from the received LDPC codeword by performing decoding corresponding to the PCM.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION

Figure 1:
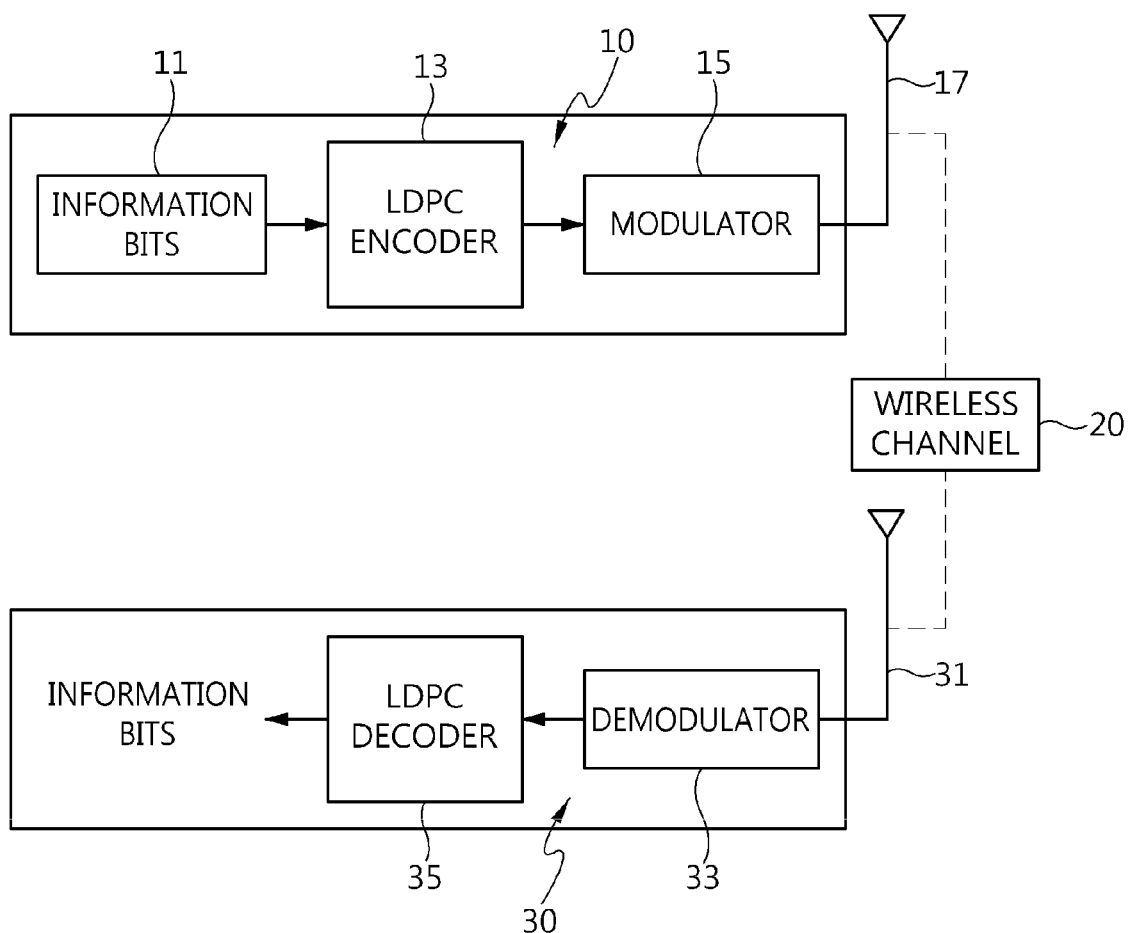
FIG. 1 is a block diagram illustrating a broadcast signal transmission and reception system according to an embodiment of the present invention.

Embodiments of the present invention will be described in detail below with reference to the accompanying drawings. Repeated descriptions and descriptions of well-known functions and configurations that have been deemed to make the gist of the present invention unnecessarily obscure will be omitted below. The embodiments of the present invention are intended to fully describe the present invention to persons having ordinary knowledge in the art to which the present invention pertains. Accordingly, the shapes, sizes, etc. of components in the drawings may be exaggerated to make the description obvious.

Embodiments of the present invention will be described in detail below with reference to the accompanying drawings.

FIG. 1 is a block diagram illustrating a broadcast signal transmission and reception system according to an embodiment of the present invention.

Referring to FIG. 1, it can be seen that a transmitter 10 and a receiver 30 communicate with each other over a wireless channel 20.

The transmitter 10 generates an n-bit codeword by encoding k information bits using an LDPC encoder 13. The codeword is modulated by the modulator 15, and is transmitted via an antenna 17. The signal transmitted via the wireless channel 20 is received via the antenna 31 of the receiver 30, and, in the receiver 30, is subjected to a process reverse to the process in the transmitter 10. That is, the received data is demodulated by a demodulator 33, and is then decoded by an LDPC decoder 35, thereby finally restoring the information bits.

It will be apparent to those skilled in the art that the above-described transmission and reception processes have been described within a minimum range required for a description of the features of the present invention and various processes required for data transmission may be added.

In the following, the specific processes of encoding and decoding that are performed using an LDPC code in the LDPC encoder 13 or LDPC decoder 35 and the specific configurations of encoding and decoding devices, such as the LDPC encoder 13 and the LDPC decoder 35, are described. The LDPC encoder 13 illustrated in FIG. 1 may have a structure illustrated in FIG. 4, and the LDPC decoder 35 may have a structure illustrated in FIG. 5.

Figure 2:
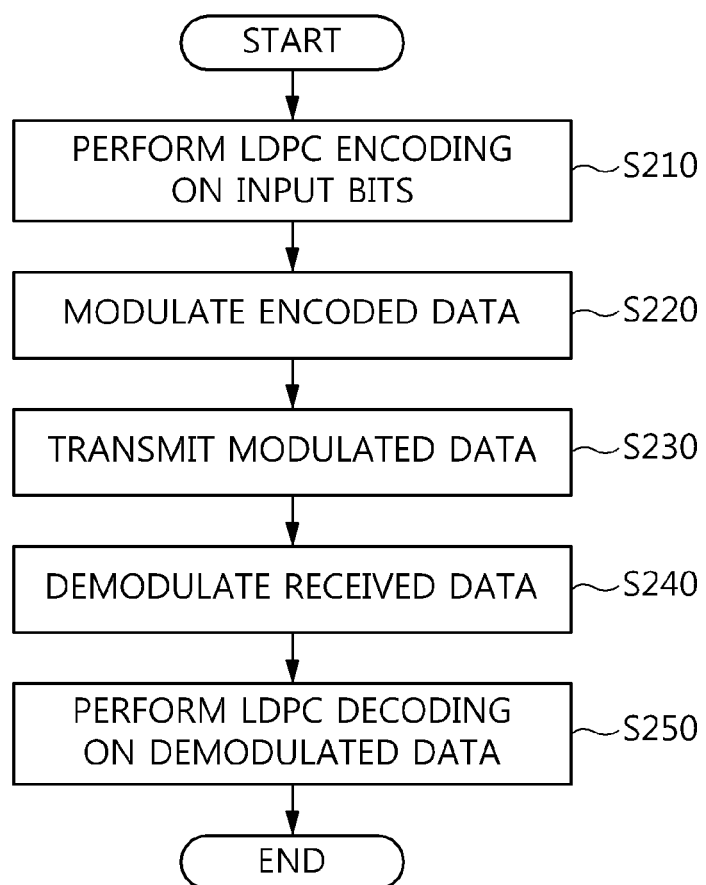
FIG. 2 is an operation flowchart illustrating a broadcast signal transmission and reception method according to an embodiment of the present invention.

FIG. 2 is an operation flowchart illustrating a broadcast signal transmission and reception method according to an embodiment of the present invention.

Referring to FIG. 2, in the broadcast signal transmission and reception method according to this embodiment of the present invention, input bits (information bits) are subjected to LDPC encoding at step S210.

That is, at step S210, an n-bit codeword is generated by encoding k information bits using the LDPC encoder.

Figure 6:
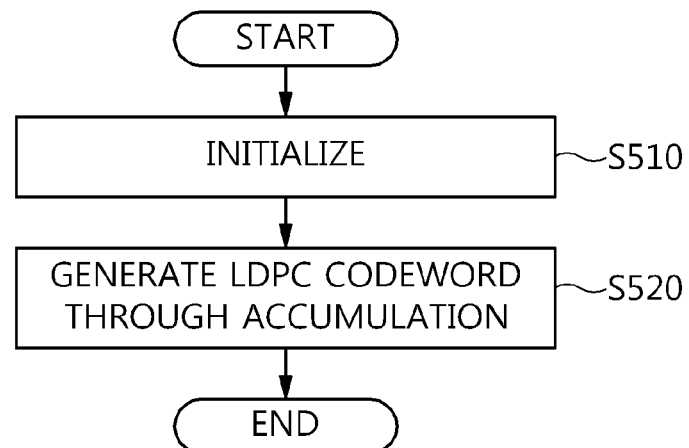
FIG. 6 is an operation flowchart illustrating an LDPC encoding method according to an embodiment of the present invention.

In this case, step S210 may be performed as in an LDPC encoding method illustrated in FIG. 6.

Furthermore, in the broadcast signal transmission and reception method, the encoded data is modulated at step S220.

That is, at step S220, the encoded n-bit codeword is modulated using the modulator.

Furthermore, in the broadcast signal transmission and reception method, the modulated data is transmitted at step S230.

That is, at step S230, the modulated codeword is transmitted over a wireless channel via the antenna.

Furthermore, in the broadcast signal transmission and reception method, the received data is demodulated at step S240.

That is, at step S240, the signal transmitted over the wireless channel is received via the antenna of the receiver, and the received data is demodulated using the demodulator.

Furthermore, in the broadcast signal transmission and reception method, the demodulated data is subjected to LDPC decoding at step S250.

That is, at step S250, the information bits are finally restored by performing LDPC decoding using the demodulator of the receiver.

Figure 5:
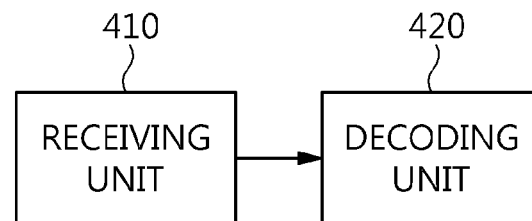
FIG. 5 is a block diagram illustrating an LDPC decoder according to an embodiment of the present invention.

In this case, step S250 corresponds to a process reverse to that of the LDPC encoding method illustrated in FIG. 6, and may correspond to the LDPC decoder of FIG. 5.

An LDPC code is known as a code very close to the Shannon limit for an additive white Gaussian noise (AWGN) channel, and has the advantages of asymptotically excellent performance and parallelizable decoding compared to a turbo code.

Generally, an LDPC code is defined by a low-density parity check matrix (PCM) that is randomly generated. However, a randomly generated LDPC code requires a large amount of memory to store a PCM, and requires a lot of time to access memory. In order to overcome these problems, a quasi-cyclic LDPC (QC-LDPC) code has been proposed. A QC-LDPC code that is composed of a zero matrix or a circulant permutation matrix (CPM) is defined by a PCM that is expressed by the following Equation 1:

$$H = \begin{bmatrix} J^{a_{11}} & J^{a_{12}} & \cdots & J^{a_{1n}} \\ J^{a_{21}} & J^{a_{22}} & \cdots & J^{a_{2n}} \\ \vdots & \vdots & \ddots & \vdots \\ J^{a_{m1}} & J^{a_{m2}} & \cdots & J^{a_{mn}} \end{bmatrix}, \text{ for } a_{ij} \in \{0, 1, \ldots, L-1, \infty\} \quad (1)$$

In this equation, J is a CPM having a size of L×L, and is given as the following Equation 2. In the following description, L may be 360.

$$J_{L \times L} = \begin{bmatrix} 0 & 1 & 0 & \cdots & 0 \\ 0 & 0 & 1 & \cdots & 0 \\ \vdots & \vdots & \vdots & \ddots & \vdots \\ 0 & 0 & 0 & \cdots & 1 \\ 1 & 0 & 0 & \cdots & 0 \end{bmatrix} \quad (2)$$

Furthermore, $J^i$ is obtained by shifting an L×L identity matrix I ($J^0$) to the right i (0≤i<L) times, and $J^\infty$ is an L×L zero matrix. Accordingly, in the case of a QC-LDPC code, it is sufficient if only index exponent i is stored in order to store $J^i$, and thus the amount of memory required to store a PCM is considerably reduced.

Figure 3:
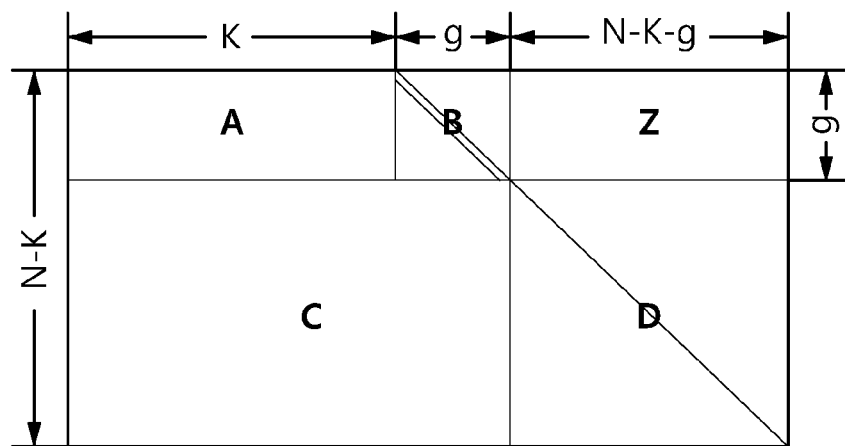
FIG. 3 is a diagram illustrating the structure of a PCM corresponding to an LDPC code to according to an embodiment of the present invention.

FIG. 3 is a diagram illustrating the structure of a PCM corresponding to an LDPC code to according to an embodiment of the present invention.

Referring to FIG. 3, the sizes of matrices A and C are g×K and (N−K−g)×(K+g), respectively, and are composed of an L×L zero matrix and a CPM, respectively. Furthermore, matrix Z is a zero matrix having a size of g×(N−K−g), matrix D is an identity matrix having a size of (N−K−g)× (N−K−g), and matrix B is a dual diagonal matrix having a size of g×g. In this case, the matrix B may be a matrix in which all elements except elements along a diagonal line and neighboring elements below the diagonal line are 0, and may be defined as the following Equation 3:

$$B_{g \times g} = \begin{bmatrix} I_{L \times L} & 0 & 0 & \cdots & 0 & 0 & 0 \\ I_{L \times L} & I_{L \times L} & 0 & \cdots & 0 & 0 & 0 \\ 0 & I_{L \times L} & I_{L \times L} & \vdots & 0 & 0 & 0 \\ \vdots & \vdots & \vdots & \ddots & \vdots & \vdots & \vdots \\ 0 & 0 & 0 & \cdots & I_{L \times L} & I_{L \times L} & 0 \\ 0 & 0 & 0 & \cdots & 0 & I_{L \times L} & I_{L \times L} \end{bmatrix} \quad (3)$$

where $I_{L \times L}$ is an identity matrix having a size of L×L.

That is, the matrix B may be a bit-wise dual diagonal matrix, or may be a block-wise dual diagonal matrix having identity matrices as its blocks, as indicated by Equation 3. The bit-wise dual diagonal matrix is disclosed in detail in Korean Patent Application Publication No. 2007-0058438, etc.

In particular, it will be apparent to those skilled in the art that when the matrix B is a bit-wise dual diagonal matrix, it is possible to perform conversion into a Quasi-cyclic form by applying row or column permutation to a PCM including the matrix B and having a structure illustrated in FIG. 3.

In this case, N is the length of a codeword, and K is the length of information.

The present invention proposes a newly designed QC-LDPC code in which the code rate thereof is 7/15 and the length of a codeword is 64800, as illustrated in the following Table 1. That is, the present invention proposes an LDPC code that is designed to receive information having a length of 30240 and generate an LDPC codeword having a length of 64800.

Table 1 illustrates the sizes of the matrices A, B, C, D and Z of the QC-LDPC code according to the present invention:

TABLE 1

| Code rate | Length | Sizes | | | | |
|---|---|---|---|---|---|---|
| | | A | B | C | D | Z |
| 7/15 | 64800 | 1080 × 30240 | 1080 × 1080 | 33480 × 31320 | 33480 × 33480 | 1080 × 33480 |

The newly designed LDPC code may be represented in the form of a sequence (progression), an equivalent relationship is established between the sequence and matrix (parity bit check matrix), and the sequence may be represented, as follows:

Sequence Table

1st row: 460 792 1007 4580 11452 13130 26882 27020 32439
2nd row: 35 472 1056 7154 12700 13326 13414 16828 19102
3rd row: 45 440 772 4854 7863 26945 27684 28651 31875
4th row: 744 812 892 1509 9018 12925 14140 21357 25106
5th row: 271 474 761 4268 6706 9609 19701 19707 24870
6th row: 223 477 662 1987 9247 18376 22148 24948 27694
7th row: 44 379 786 8823 12322 14666 16377 28688 29924
8th row: 104 219 562 5832 19665 20615 21043 22759 32180
9th row: 41 43 870 7963 13718 14136 17216 30470 33428
10th row: 592 744 887 4513 6192 18116 19482 25032 34095
11th row: 456 821 1078 7162 7443 8774 15567 17243 33085
12th row: 151 666 977 6946 10358 11172 18129 19777 32234
13th row: 236 793 870 2001 6805 9047 13877 30131 34252
14th row: 297 698 772 3449 4204 11608 22950 26071 27512
15th row: 202 428 474 3205 3726 6223 7708 20214 25283
16th row: 139 719 915 1447 2938 11864 15932 21748 28598
17th row: 135 853 902 3239 18590 20579 30578 33374 34045
18th row: 9 13 971 11834 13642 17628 21669 24741 30965
19th row: 344 531 730 1880 16895 17587 21901 28620 31957
20th row: 7 192 380 3168 3729 5518 6827 20372 34168

Sequence Table

21st row: 28 521 681 4313 7465 14209 21501 23364 25980
22nd row: 269 393 898 3561 11066 11985 17311 26127 30309
23rd row: 42 82 707 4880 4890 9818 23340 25959 31695
24th row: 189 262 707 6573 14082 22259 24230 24390 24664
25th row: 383 568 573 5498 13449 13990 16904 22629 34203
26th row: 585 596 820 2440 2488 21956 28261 28703 29591
27th row: 755 763 795 5636 16433 21714 23452 31150 34545
28th row: 23 343 669 1159 3507 13096 17978 24241 34321
29th row: 316 384 944 4872 8491 18913 21085 23198 24798
30th row: 64 314 765 3706 7136 8634 14227 17127 23437
31st row: 220 693 899 8791 12417 13487 18335 22126 27428
32nd row: 285 794 1045 8624 8801 9547 19167 21894 32657
33rd row: 386 621 1045 1634 1882 3172 13686 16027 22448
34th row: 95 622 693 2827 7098 11452 14112 18831 31308
35th row: 446 813 928 7976 8935 13146 27117 27766 33111
36th row: 89 138 241 3218 9283 20458 31484 31538 34216
37th row: 277 420 704 9281 12576 12788 14496 15357 20585
38th row: 141 643 758 4894 10264 15144 16357 22478 26461
39th row: 17 108 160 13183 15424 17939 19276 23714 26655
40th row: 109 285 608 1682 20223 21791 24615 29622 31983
41st row: 123 515 622 7037 13946 15292 15606 16262 23742
42nd row: 264 565 923 6460 13622 13934 23181 25475 26134
43rd row: 202 548 789 8003 10993 12478 16051 25114 27579
44th row: 121 450 575 5972 10062 18693 21852 23874 28031
45th row: 507 560 889 12064 13316 19629 21547 25461 28732
46th row: 664 786 1043 9137 9294 10163 23389 31436 34297
47th row: 45 830 907 10730 16541 21232 30354 30605 31847
48th row: 203 507 1060 6971 12216 13321 17861 22671 29825
49th row: 369 881 952 3035 12279 12775 17682 17805 34281
50th row: 683 709 1032 3787 17623 24138 26775 31432 33626
51st row: 524 792 1042 12249 14765 18601 25811 32422 33163
52nd row: 137 639 688 7182 8169 10443 22530 24597 29039
53rd row: 159 643 749 16386 17401 24135 28429 33468 33469
54th row: 107 481 555 7322 13234 19344 23498 26581 31378

Sequence Table

55th row: 249 389 523 3421 10150 17616 19085 20545 32069
56th row: 395 738 1045 2415 3005 3820 19541 23543 31068
57th row: 27 293 703 1717 3460 8326 8501 10290 32625
58th row: 126 247 515 6031 9549 10643 22067 29490 34450
59th row: 331 471 1007 3020 3922 7580 23358 28620 30946
60th row: 222 542 1021 3291 3652 13130 16349 33009 34348
61st row: 532 719 1038 5891 7528 23252 25472 31395 31774
62nd row: 145 398 774 7816 13887 14936 23708 31712 33160
63rd row: 88 536 600 1239 1887 12195 13782 16726 27998
64th row: 151 269 585 1445 3178 3970 15568 20358 21051
65th row: 650 819 865 15567 18546 25571 32038 33350 33620
66th row: 93 469 800 6059 10405 12296 17515 21354 22231
67th row: 97 206 951 6161 16376 27022 29192 30190 30665
68th row: 412 549 986 5833 10583 10766 24946 28878 31937
69th row: 72 604 659 5267 12227 21714 32120 33472 33974
70th row: 25 902 912 1137 2975 9642 11598 25919 28278
71st row: 420 976 1055 8473 11512 20198 21662 25443 30119
72nd row: 1 24 932 6426 11899 13217 13935 16548 29737
73rd row: 53 618 988 6280 7267 11676 13575 15532 25787
74th row: 111 739 809 8133 12717 12741 20253 20608 27850
75th row: 120 683 943 14496 15162 15440 18660 27543 32404
76th row: 600 754 1055 7873 9679 17351 27268 33508
77th row: 344 756 1054 7102 7193 22903 24720 27883
78th row: 582 1003 1046 11344 23756 27497 27977 32853
79th row: 28 429 509 11106 11767 12729 13100 31792
80th row: 131 555 907 5113 10259 10300 20580 23029

-continued

Sequence Table

81st row: 406 915 977 12244 20259 26616 27899 32228
82nd row: 46 195 224 1229 4116 10263 13608 17830
83rd row: 19 819 953 7965 9998 13959 30580 30754
84th row: 164 1003 1032 12920 15975 16582 22624 27357
85th row: 8433 11894 13531 17675 25889 31384
86th row: 3166 3813 8596 10368 25104 29584
87th row: 2466 8241 12424 13376 24837 32711

An LDPC code that is represented in the form of a sequence is being widely used in the DVB standard.

According to an embodiment of the present invention, an LDPC code presented in the form of a sequence is encoded, as follows. It is assumed that there is an information block $S=(s_0, s_1, \ldots, s_{K+1})$ having an information size K. The LDPC encoder generates a codeword $A=(\lambda_0, \lambda_1, \lambda_2, \ldots, \lambda_{N-1})$ having a size of $N=K+M_1+M_2$ using the information block S having a size K. In this case, $M_1=g$, and $M_2=N-K-g$. Furthermore, $M_1$ is the size of parity bits corresponding to the dual diagonal matrix B, and $M_2$ is the size of parity bits corresponding to the identity matrix D. The encoding process is performed, as follows:

Initialization:

$$\lambda_i = s_i \text{ for } i=0,1,\ldots,K-1$$

$$p_j=0 \text{ for } j=0,1,\ldots,M_1+M_2-1 \quad (4)$$

First information bit $\lambda_0$ is accumulated at parity bit addresses specified in the 1st row of the sequence of the Sequence Table. For example, in an LDPC code having a length of 64800 and a code rate of 7/15, an accumulation process is as follows:

$$p_{460}=p_{460}\oplus\lambda_0 \; p_{792}=p_{792}\oplus\lambda_0 \; p_{1007}=p_{1007}\oplus\lambda_0$$
$$p_{4580}=p_{4580}\oplus\lambda_0 \; p_{11452}=p_{11452}\oplus\lambda_0$$
$$p_{13130}=p_{13130}\oplus\lambda_0 \; p_{26882}=p_{26882}\oplus\lambda_0$$
$$p_{27020}=p_{27020}\oplus\lambda_0 \; p_{32439}=p_{32439}\oplus\lambda_0$$

where the addition $\oplus$ occurs in GF(2).

The subsequent L−1 information bits, that is, m=1, 2, . . . , L−1, are accumulated at parity bit addresses that are calculated by the following Equation 5:

$$(x+m\times Q_1)\bmod M_1 \text{ if } x<M_1$$

$$M_1+\{(x-M_1+m\times Q_2)\bmod m_2\} \text{ if } x\geq M_1 \quad (5)$$

where x denotes the addresses of parity bits corresponding to the first information bit $\lambda_0$, that is, the addresses of the parity bits specified in the first row of the sequence of the Sequence Table, $Q_1=M_1/L$, $Q_2=M_2/L$, and $L=360$. Furthermore, $Q_1$ and $Q_2$ are defined in the following Table 2. For example, for an LDPC code having a length of 64800 and a code rate of 7/15, $M_1=1080$, $Q_1=3$, $M_2=33480$, $Q_2=93$ and $L=360$, and the following operations are performed on the second bit $\lambda_1$ using Equation 5:

$$p_{463}=p_{463}\oplus\lambda_1 \; p_{795}=p_{795}\oplus\lambda_1 \; p_{1010}=p_{1010}\oplus\lambda_1$$
$$p_{4673}=p_{4673}\oplus\lambda_1 \; p_{11545}=p_{11545}\oplus\lambda_1$$
$$p_{13223}=p_{13223}\oplus\lambda_1 \; p_{26975}=p_{26975}\oplus\lambda_1$$
$$p_{27113}=p_{27113}\oplus\lambda_1 \; p_{32532}=p_{32532}\oplus\lambda_1$$

Table 2 illustrates the sizes of $M_1$, $Q_1$, $M_2$ and $Q_2$ of the designed QC-LDPC code:

TABLE 2

| | | Sizes | | | |
|---|---|---|---|---|---|
| Code rate | Length | $M_1$ | $M_2$ | $Q_1$ | $Q_2$ |
| 7/15 | 64800 | 1080 | 33480 | 3 | 93 |

The addresses of parity bit accumulators for new 360 information bits from $\lambda_L$ to $\lambda_{2L-1}$ are calculated and accumulated from Equation 5 using the second row of the sequence.

In a similar manner, for all groups composed of new L information bits, the addresses of parity bit accumulators are calculated and accumulated from Equation 5 using new rows of the sequence.

After all the information bits from $\lambda_0$ to $\lambda_{K-1}$ have been exhausted, the operations of the following Equation 6 are sequentially performed from i=1:

$$p_i=p_i\oplus p_{i-1} \text{ for } i=0,1,\ldots,M_1-1 \quad (6)$$

Thereafter, when a parity interleaving operation, such as that of the following Equation 7, is performed, parity bits corresponding to the dual diagonal matrix B are generated:

$$\lambda_{K+L\cdot t+s}=p_{Q_1\cdot s+t} \text{ for } 0\leq s<L, 0\leq t<Q_1 \quad (7)$$

When the parity bits corresponding to the dual diagonal matrix B have been generated using K information bits $\lambda_0$, $\lambda_1, \ldots, \lambda_{K-1}$, parity bits corresponding to the identity matrix D are generated using the $M_1$ generated parity bits $\lambda_K$, $\lambda_{K+1}, \ldots, \lambda_{K+M_1-1}$.

For all groups composed of L information bits from $\lambda_K$ to $\lambda_{K+M_1-1}$, the addresses of parity bit accumulators are calculated using the new rows (starting with a row immediately subsequent to the last row used when the parity bits corresponding to the dual diagonal matrix B have been generated) of the sequence and Equation 5, and related operations are performed.

When a parity interleaving operation, such as that of the following Equation 8, is performed after all the information bits from $\lambda_K$ to $\lambda_{K+m_1-1}$ have been exhausted, parity bits corresponding to the identity matrix D are generated:

$$\lambda_{K+M_1+L\cdot t+s}=p_{M_1+Q_2\cdot s+t} \text{ for } 0\leq s<L, 0\leq t<Q_2 \quad (8)$$

Figure 4:
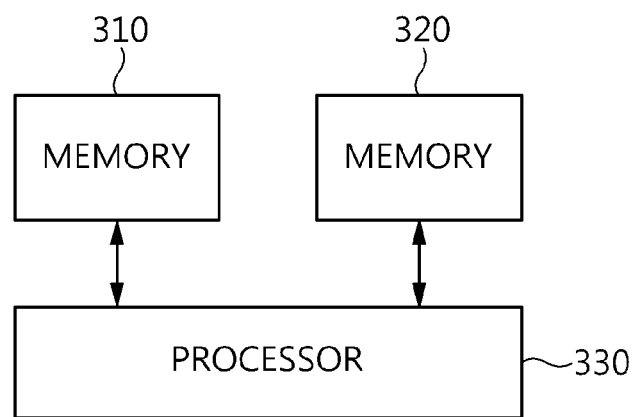
FIG. 4 is a block diagram illustrating an LDPC encoder according to an embodiment of the present invention.

FIG. 4 is a block diagram illustrating an LDPC encoder according to an embodiment of the present invention.

Referring to FIG. 4, the LDPC encoder according to this embodiment of the present invention includes memory 310 and 320 and a processor 330.

The memory 310 is memory that is used to store an LDPC codeword having a length of 64800 and a code rate of 7/15.

The memory 320 is memory that is initialized to 0.

The memory 310 and the memory 320 may correspond to $\lambda_i$ (i=0,1, . . . , N−1) and $p_j$ (j=0,1, . . . , $M_1+M_2-1$), respectively.

The memory 310 and the memory 320 may correspond to various types of hardware for storing sets of bits, and may correspond to data structures, such as an array, a list, a stack and a queue.

The processor 330 generates an LDPC codeword corresponding to information bits by performing accumulation with respect to the memory 320 using a sequence corresponding to a PCM.

In this case, the accumulation may be performed at parity bit addresses that are updated using the sequence of the above Sequence Table.

In this case, the LDPC codeword may include a systematic part $\lambda_0, \lambda_1, \ldots, \lambda_{K-1}$ corresponding to the information bits and having a length of 30240 (=K), a first parity part $\lambda_K$, $\lambda_{K+1}, \ldots, \lambda_{K+M_1-1}$ corresponding to a dual diagonal matrix included in the PCM and having a length of 1080 (=$M_1$=g), and a second parity part $\lambda_{K+M_1}, \lambda_{K+M_1+1}, \ldots, \lambda_{K+M_1M_2-1}$ corresponding to an identity matrix included in the PCM and having a length of 33480 (=$M_2$).

In this case, the sequence may have a number of rows equal to the sum (30240/360+1080/360=87) of a value obtained by dividing the length of the systematic part, that is, 30240, by a CPM size L corresponding to the PCM, that is, 360, and a value obtained by dividing the length $M_1$ of the first parity part, that is, 1080, by 360.

As described above, the sequence may be represented by the above Sequence Table.

In this case, the memory 320 may have a size corresponding to the sum $M_1+M_2$ of the length $M_1$ of the first parity part and the length $M_2$ of the second parity part.

In this case, the parity bit addresses may be updated based on the results of comparing each x of the previous parity bit addresses specified in respective rows of the sequence with the length $M_1$ of the first parity part.

That is, the parity bit addresses may be updated using Equation 5. In this case, x may be the previous parity bit addresses, m may be an information bit index that is an integer larger than 0 and smaller than L, L may be the CPM size of the PCM, $Q_1$ may be $M_1/L$, $M_1$ may be the size of the first parity part, $Q_2$ may be $M_2/L$, and $M_2$ may be the size of the second parity part.

In this case, it may be possible to perform the accumulation while repeatedly changing the rows of the sequence by the CPM size L (=360) of the PCM, as described above.

In this case, the first parity part $\lambda_K, \lambda_{K+1}, \ldots, \lambda_{K+M_1-1}$ may be generated by performing parity interleaving using the memory 310 and the memory 320, as described in conjunction with Equation 7.

In this case, the second parity part $\lambda_{K+M_1}, \lambda_{K+M_1+1}, \ldots, \lambda_{K+M_1+M_2-1}$ may be generated by performing parity interleaving using the memory 310 and the memory 320 after generating the first parity part $\lambda_K, \lambda_{K+1}, \ldots, \lambda_{K+M_1-1}$ and then performing the accumulation using the first parity part $\lambda_K, \lambda_{K+1}, \ldots, \lambda_{K+M_1-1}$ and the sequence, as described in conjunction with Equation 8.

FIG. 5 is a block diagram illustrating an LDPC decoder according to an embodiment of the present invention.

Referring to FIG. 5, the LDPC decoder according to this embodiment of the present invention may include a receiving unit 410 and a decoding unit 420.

The receiving unit 410 receives an LDPC codeword that has been encoded using a sequence that corresponds to a PCM and is represented by the above Sequence Table.

The decoding unit 420 restores information bits from the received LDPC codeword by performing decoding corresponding to the PCM.

In this case, the sequence may be used to update the parity bit addresses of the memory, and the parity bit addresses are used for accumulation that is performed to generate parity bits corresponding to the LDPC codeword.

In this case, the LDPC codeword may include a systematic part $\lambda_0, \lambda_1, \ldots, \lambda_{K-1}$ corresponding to the information bits, a first parity part $\lambda_K, \lambda_{K+1}, \ldots, \lambda_{K+M_1-1}$ corresponding to a dual diagonal matrix included in the PCM, and a second parity part $\lambda_{K+M_1}, \lambda_{K+M_1+1}, \ldots, \lambda_{K+M_1+M_2-1}$ corresponding to an identity matrix included in the PCM.

In this case, the parity bit addresses may be updated based on the results of comparing each x of the previous parity bit addresses specified in respective rows of the sequence with the length $M_1$ of the first parity part.

That is, the parity bit addresses may be updated using Equation 5. In this case, x may be the previous parity bit addresses, m may be an information bit index that is an integer larger than 0 and smaller than L, L may be the CPM size of the PCM, $Q_1$ may be $M_1/L$, $M_1$ may be the size of the first parity part, $Q_2$ may be $M_2/L$, and $M_2$ may be the size of the second parity part.

FIG. 6 is an operation flowchart illustrating an LDPC encoding method according to an embodiment of the present invention.

Referring to FIG. 6, the LDPC encoding method according to this embodiment of the present invention initializes the first memory that stores an LDPC codeword having a length of 64800 and a code rate of 7/15, and second memory at step S510.

In this case, step S510 may be performed using Equation 4.

Furthermore, in the LDPC encoding method according to this embodiment of the present invention, an LDPC codeword corresponding to information bits is generated by performing accumulation with respect to the second memory using a sequence corresponding to a PCM at step S520.

In this case, the accumulation may be performed at parity bit addresses that are updated using the sequence corresponding to the PCM.

In this case, the LDPC codeword may include a systematic part $\lambda_0, \lambda_1, \ldots, \lambda_{K-1}$ corresponding to the information bits and having a length of 30240 (=K), a first parity part $\lambda_K, \lambda_{K+1}, \ldots, \lambda_{K+M_1-1}$ corresponding to a dual diagonal matrix included in the PCM and having a length of 1080 (=$M_1$=g), and a second parity part $\lambda_{K+M_1}, \lambda_{K+M_1+1}, \ldots, \lambda_{K+M_1+M_2-1}$ corresponding to an identity matrix included in the PCM and having a length of 33480 (=$M_2$).

In this case, the sequence may have a number of rows equal to the sum (30240/360+1080/360=87) of a value obtained by dividing the length of the systematic part, that is, 30240, by a CPM size L corresponding to the PCM, that is, 360, and a value obtained by dividing the length $M_1$ of the first parity part, that is, 1080, by 360.

As described above, the sequence may be represented by the above Sequence Table.

In this case, the parity bit addresses may be updated based on the results of comparing each x of the previous parity bit addresses specified in respective rows of the sequence with the length $M_1$ of the first parity part.

That is, the parity bit addresses may be updated using Equation 5. In this case, x may be the previous parity bit addresses, m may be an information bit index that is an integer larger than 0 and smaller than L, L may be the CPM size of the PCM, $Q_1$ may be $M_1/L$, $M_1$ may be the size of the first parity part, $Q_2$ may be $M_2/L$, and $M_2$ may be the size of the second parity part.

In this case, it may be possible to perform the accumulation while repeatedly changing the rows of the sequence by the CPM size L (=360) of the PCM, as described above.

In this case, the first parity part $\lambda_K, \lambda_{K+1}, \ldots, \lambda_{K+M_1-1}$ may be generated by performing parity interleaving using the memory 310 and the memory 320, as described in conjunction with Equation 7.

In this case, the second parity part $\lambda_{K+M_1}, \lambda_{K+M_1+1}, \ldots, \lambda_{K+M_1+M_2-1}$ may be generated by performing parity interleaving using the memory 310 and the memory 320 after generating the first parity part $\lambda_K, \lambda_{K+1}, \ldots, \lambda_{K+M_1-1}$ and then performing the accumulation using the first parity part $\lambda_K, \lambda_{K+1}, \ldots, \lambda_{K+M_1-1}$ and the sequence, as described in conjunction with Equation 8.

Figure 7:
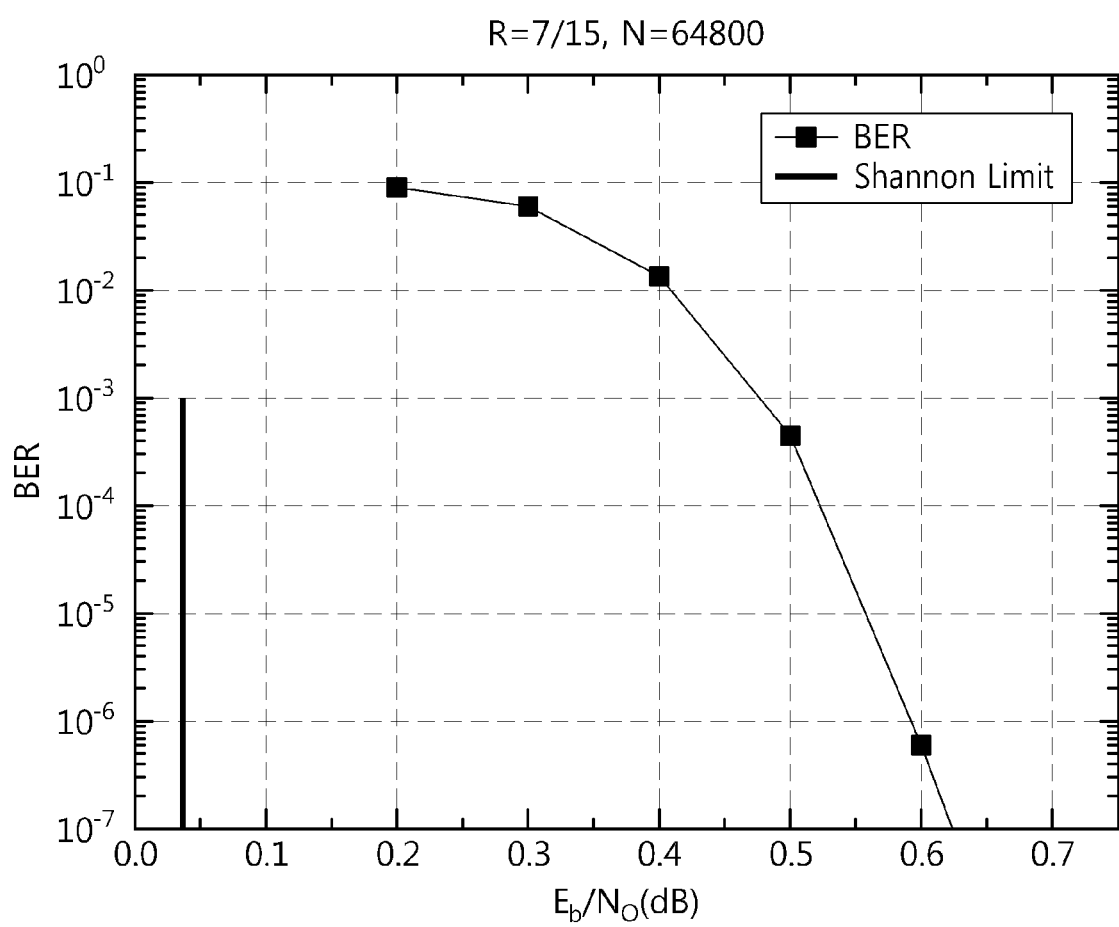
FIG. 7 is a graph plotting the performance of a QC-LDPC code having a length of 64800 and a code rate of 7/15 according to an embodiment of the present invention against $E_b/N_o$.

FIG. 7 is a graph plotting the performance of a QC-LDPC code having a length of 64800 and a code rate of 7/15 according to an embodiment of the present invention against $E_b/N_o$.

The graph illustrated in FIG. 7 illustrates results that were obtained on the assumption that a log-likelihood ratio (LLR)-based sum-product algorithm in which binary phase shift keying (BPSK) modulation and 50 rounds of repetitive decoding were performed was used for computational experiments. As illustrated in FIG. 7, it can be seen that the designed code is away from the Shannon limit by about 0.6 dB at BER=$10^{-6}$.

At least one embodiment of the present invention has the advantage of providing a new LDPC codeword having a length of 64800 and a code rate of 7/15, which is capable of being used for general purposes.

At least one embodiment of the present invention has the advantage of providing an LDPC encoding technique that is capable of efficiently performing LDPC encoding using a sequence having a number of rows equal to a value that is obtained by dividing the sum of the length of the systematic part of an LDPC codeword, that is, 30240, and the length of the first parity part of the LDPC codeword, that is, 1080, by 360.

Although the specific embodiments of the present invention have been disclosed for illustrative purposes, those skilled in the art will appreciate that various modifications, additions and substitutions are possible without departing from the scope and spirit of the invention as disclosed in the accompanying claims.

What is claimed is:

1. A low density parity check (LDPC) decoder, comprising:
a receiving unit configured to receive a signal corresponding to an LDPC codeword having a length of 64800 and a code rate of 7/15, the LDPC codeword encoded using a sequence corresponding to a parity check matrix (PCM); and
a decoding unit configured to perform decoding the received signal, the decoding corresponding to the parity check matrix,
wherein the sequence is represented by the following Sequence Table:

| Sequence Table |
|---|
| 1st row: 460 792 1007 4580 11452 13130 26882 27020 32439 |
| 2nd row: 35 472 1056 7154 12700 13326 13414 16828 19102 |
| 3rd row: 45 440 772 4854 7863 26945 27684 28651 31875 |
| 4th row: 744 812 892 1509 9018 12925 14140 21357 25106 |
| 5th row: 271 474 761 4268 6706 9609 19701 19707 24870 |
| 6th row: 223 477 662 1987 9247 18376 22148 24948 27694 |
| 7th row: 44 379 786 8823 12322 14666 16377 28688 29924 |
| 8th row: 104 219 562 5832 19665 20615 21043 22759 32180 |
| 9th row: 41 43 870 7963 13718 14136 17216 30470 33428 |
| 10th row: 592 744 887 4513 6192 18116 19482 25032 34095 |
| 11th row: 456 821 1078 7162 7443 8774 15567 17243 33085 |
| 12th row: 151 666 977 6946 10358 11172 18129 19777 32234 |
| 13th row: 236 793 870 2001 6805 9047 13877 30131 34252 |
| 14th row: 297 698 772 3449 4204 11608 22950 26071 27512 |
| 15th row: 202 428 474 3205 3726 6223 7708 20214 25283 |
| 16th row: 139 719 915 1447 2938 11864 15932 21748 28598 |
| 17th row: 135 853 902 3239 18590 20579 30578 33374 34045 |
| 18th row: 9 13 971 11834 13642 17628 21669 24741 30965 |
| 19th row: 344 531 730 1880 16895 17587 21901 28620 31957 |
| 20th row: 7 192 380 3168 3729 5518 6827 20372 34168 |
| 21st row: 28 521 681 4313 7465 14209 21501 23364 25980 |
| 22nd row: 269 393 898 3561 11066 11985 17311 26127 30309 |
| 23rd row: 42 82 707 4880 4890 9818 23340 25959 31695 |
| 24th row: 189 262 707 6573 14082 22259 24230 24390 24664 |
| 25th row: 383 568 573 5498 13449 13990 16904 22629 34203 |
| 26th row: 585 596 820 2440 2488 21956 28261 28703 29591 |
| 27th row: 755 763 795 5636 16433 21714 23452 31150 34545 |
| 28th row: 23 343 669 1159 3507 13096 17978 24241 34321 |
| 29th row: 316 384 944 4872 8491 18913 21085 23198 24798 |
| 30th row: 64 314 765 3706 7136 8634 14227 17127 23437 |
| 31st row: 220 693 899 8791 12417 13487 18335 22126 27428 |
| 32nd row: 285 794 1045 8624 8801 9547 19167 21894 32657 |
| 33rd row: 386 621 1045 1634 1882 3172 13686 16027 22448 |
| 34th row: 95 622 693 2827 7098 11452 14112 18831 31308 |
| 35th row: 446 813 928 7976 8935 13146 27117 27766 33111 |
| 36th row: 89 138 241 3218 9283 20458 31484 31538 34216 |
| 37th row: 277 420 704 9281 12576 12788 14496 15357 20585 |
| 38th row: 141 643 758 4894 10264 15144 16357 22478 26461 |
| 39th row: 17 108 160 13183 15424 17939 19276 23714 26655 |
| 40th row: 109 285 608 1682 20223 21791 24615 29622 31983 |
| 41st row: 123 515 622 7037 13946 15292 15606 16262 23742 |
| 42nd row: 264 565 923 6460 13622 13934 23181 25475 26134 |
| 43rd row: 202 548 789 8003 10993 12478 16051 25114 27579 |
| 44th row: 121 450 575 5972 10062 18693 21852 23874 28031 |
| 45th row: 507 560 889 12064 13316 19629 21547 25461 28732 |
| 46th row: 664 786 1043 9137 9294 10163 23389 31436 34297 |
| 47th row: 45 830 907 10730 16541 21232 30354 30605 31847 |
| 48th row: 203 507 1060 6971 12216 13321 17861 22671 29825 |
| 49th row: 369 881 952 3035 12279 12775 17682 17805 34281 |
| 50th row: 683 709 1032 3787 17623 24138 26775 31432 33626 |
| 51st row: 524 792 1042 12249 14765 18601 25811 32422 33163 |
| 52nd row: 137 639 688 7182 8169 10443 22530 24597 29039 |
| 53rd row: 159 643 749 16386 17401 24135 28429 33468 33469 |
| 54th row: 107 481 555 7322 13234 19344 23498 26581 31378 |
| 55th row: 249 389 523 3421 10150 17616 19085 20545 32069 |
| 56th row: 395 738 1045 2415 3005 3820 19541 23543 31068 |
| 57th row: 27 293 703 1717 3460 8326 8501 10290 32625 |
| 58th row: 126 247 515 6031 9549 10643 22067 29490 34450 |
| 59th row: 331 471 1007 3020 3922 7580 23358 28620 30946 |
| 60th row: 222 542 1021 3291 3652 13130 16349 33009 34348 |
| 61st row: 532 719 1038 5891 7528 23252 25472 31395 31774 |
| 62nd row: 145 398 774 7816 13887 14936 23708 31712 33160 |
| 63rd row: 88 536 600 1239 1887 12195 13782 16726 27998 |
| 64th row: 151 269 585 1445 3178 3970 15568 20358 21051 |
| 65th row: 650 819 865 15567 18546 25571 32038 33350 33620 |
| 66th row: 93 469 800 6059 10405 12296 17515 21354 22231 |
| 67th row: 97 206 951 6161 16376 27022 29192 30190 30665 |
| 68th row: 412 549 986 5833 10583 10766 24946 28878 31937 |
| 69th row: 72 604 659 5267 12227 21714 32120 33472 33974 |
| 70th row: 25 902 912 1137 2975 9642 11598 25919 28278 |
| 71st row: 420 976 1055 8473 11512 20198 21662 25443 30119 |
| 72nd row: 1 24 932 6426 11899 13217 13935 16548 29737 |
| 73rd row: 53 618 988 6280 7267 11676 13575 15532 25787 |
| 74th row: 111 739 809 8133 12717 12741 20253 20608 27850 |
| 75th row: 120 683 943 14496 15162 15440 18660 27543 32404 |
| 76th row: 600 754 1055 7873 9679 17351 27268 33508 |
| 77th row: 344 756 1054 7102 7193 22903 24720 27883 |
| 78th row: 582 1003 1046 11344 23756 27497 27977 32853 |
| 79th row: 28 429 509 11106 11767 12729 13100 31792 |
| 80th row: 131 555 907 5113 10259 10300 20580 23029 |
| 81st row: 406 915 977 12244 20259 26616 27899 32228 |
| 82nd row: 46 195 224 1229 4116 10263 13608 17830 |
| 83rd row: 19 819 953 7965 9998 13959 30580 30754 |
| 84th row: 164 1003 1032 12920 15975 16582 22624 27357 |
| 85th row: 8433 11894 13531 17675 25889 31384 |
| 86th row: 3166 3813 8596 10368 25104 29584 |
| 87th row: 2466 8241 12424 13376 24837 32711. |

2. The LDPC decoder of claim 1, wherein the LDPC codeword comprises a systematic part corresponding to the information bits and having a length of 30240, a first parity part corresponding to a dual diagonal matrix included in the PCM and having a length of 1080, and a second parity part corresponding to an identity matrix included in the PCM and having a length of 33480.

3. The LDPC decoder of claim 2, wherein the sequence has a number of rows equal to a sum of a value obtained by dividing a length of the systematic part, that is, 30240, by a circulant permutation matrix (CPM) size corresponding to the PCM, that is, 360, and a value obtained by dividing a length of the first parity part, that is, 1080, by the CPM size.

4. The LDPC decoder of claim 1, wherein the LDPC codeword is generated by performing accumulation with respect to a memory and the accumulation is performed at parity bit addresses that are updated using the sequence.

5. The LDPC decoder of claim 4, wherein the accumulation is performed while the rows of the sequence are being repeatedly changed by the CPM size of the PCM.

6. A low density parity check (LDPC) decoding method, comprising:

receiving a signal corresponding to an LDPC codeword having a length of 64800 and a code rate of 7/15, the LDPC codeword encoded using a sequence corresponding to a parity check matrix (PCM); and decoding the received signal, the decoding corresponding to the parity check matrix, wherein the sequence is represented by the following Sequence Table:

| Sequence Table |
|---|
| 1st row: 460 792 1007 4580 11452 13130 26882 27020 32439 |
| 2nd row: 35 472 1056 7154 12700 13326 13414 16828 19102 |
| 3rd row: 45 440 772 4854 7863 26945 27684 28651 31875 |
| 4th row: 744 812 892 1509 9018 12925 14140 21357 25106 |
| 5th row: 271 474 761 4268 6706 9609 19701 19707 24870 |
| 6th row: 223 477 662 1987 9247 18376 22148 24948 27694 |
| 7th row: 44 379 786 8823 12322 14666 16377 28688 29924 |
| 8th row: 104 219 562 5832 19665 20615 21043 22759 32180 |
| 9th row: 41 43 870 7963 13718 14136 17216 30470 33428 |
| 10th row: 592 744 887 4513 6192 18116 19482 25032 34095 |
| 11th row: 456 821 1078 7162 7443 8774 15567 17243 33085 |
| 12th row: 151 666 977 6946 10358 11172 18129 19777 32234 |
| 13th row: 236 793 870 2001 6805 9047 13877 30131 34252 |
| 14th row: 297 698 772 3449 4204 11608 22950 26071 27512 |
| 15th row: 202 428 474 3205 3726 6223 7708 20214 25283 |
| 16th row: 139 719 915 1447 2938 11864 15932 21748 28598 |
| 17th row: 135 853 902 3239 18590 20579 30578 33374 34045 |
| 18th row: 9 13 971 11834 13642 17628 21669 24741 30965 |
| 19th row: 344 531 730 1880 16895 17587 21901 28620 31957 |
| 20th row: 7 192 380 3168 3729 5518 6827 20372 34168 |
| 21st row: 28 521 681 4313 7465 14209 21501 23364 25980 |
| 22nd row: 269 393 898 3561 11066 11985 17311 26127 30309 |
| 23rd row: 42 82 707 4880 4890 9818 23340 25959 31695 |
| 24th row: 189 262 707 6573 14082 22259 24230 24390 24664 |
| 25th row: 383 568 573 5498 13449 13990 16904 22629 34203 |
| 26th row: 585 596 820 2440 2488 21956 28261 28703 29591 |
| 27th row: 755 763 795 5636 16433 21714 23452 31150 34545 |
| 28th row: 23 343 669 1159 3507 13096 17978 24241 34321 |
| 29th row: 316 384 944 4872 8491 18913 21085 23198 24798 |
| 30th row: 64 314 765 3706 7136 8634 14227 17127 23437 |
| 31st row: 220 693 899 8791 12417 13487 18335 22126 27428 |
| 32nd row: 285 794 1045 8624 8801 9547 19167 21894 32657 |
| 33rd row: 386 621 1045 1634 1882 3172 13686 16027 22448 |
| 34th row: 95 622 693 2827 7098 11452 14112 18831 31308 |
| 35th row: 446 813 928 7976 8935 13146 27117 27766 33111 |
| 36th row: 89 138 241 3218 9283 20458 31484 31538 34216 |
| 37th row: 277 420 704 9281 12576 12788 14496 15357 20585 |
| 38th row: 141 643 758 4894 10264 15144 16357 22478 26461 |
| 39th row: 17 108 160 13183 15424 17939 19276 23714 26655 |
| 40th row: 109 285 608 1682 20223 21791 24615 29622 31983 |
| 41st row: 123 515 622 7037 13946 15292 15606 16262 23742 |
| 42nd row: 264 565 923 6460 13622 13934 23181 25475 26134 |
| 43rd row: 202 548 789 8003 10993 12478 16051 25114 27579 |
| 44th row: 121 450 575 5972 10062 18693 21852 23874 28031 |
| 45th row: 507 560 889 12064 13316 19629 21547 25461 28732 |
| 46th row: 664 786 1043 9137 9294 10163 23389 31436 34297 |
| 47th row: 45 830 907 10730 16541 21232 30354 30605 31847 |
| 48th row: 203 507 1060 6971 12216 13321 17861 22671 29825 |
| 49th row: 369 881 952 3035 12279 12775 17682 17805 34281 |
| 50th row: 683 709 1032 3787 17623 24138 26775 31432 33626 |
| 51st row: 524 792 1042 12249 14765 18601 25811 32422 33163 |
| 52nd row: 137 639 688 7182 8169 10443 22530 24597 29039 |
| 53rd row: 159 643 749 16386 17401 24135 28429 33468 33469 |
| 54th row: 107 481 555 7322 13234 19344 23498 26581 31378 |
| 55th row: 249 389 523 3421 10150 17616 19085 20545 32069 |
| 56th row: 395 738 1045 2415 3005 3820 19541 23543 31068 |
| 57th row: 27 293 703 1717 3460 8326 8501 10290 32625 |
| 58th row: 126 247 515 6031 9549 10643 22067 29490 34450 |
| 59th row: 331 471 1007 3020 3922 7580 23358 28620 30946 |
| 60th row: 222 542 1021 3291 3652 13130 16349 33009 34348 |
| 61st row: 532 719 1038 5891 7528 23252 25472 31395 31774 |
| 62nd row: 145 398 774 7816 13887 14936 23708 31712 33160 |
| 63rd row: 88 536 600 1239 1887 12195 13782 16726 27998 |
| 64th row: 151 269 585 1445 3178 3970 15568 20358 21051 |
| 65th row: 650 819 865 15567 18546 25571 32038 33350 33620 |
| 66th row: 93 469 800 6059 10405 12296 17515 21354 22231 |
| 67th row: 97 206 951 6161 16376 27022 29192 30190 30665 |
| 68th row: 412 549 986 5833 10583 10766 24946 28878 31937 |
| 69th row: 72 604 659 5267 12227 21714 32120 33472 33974 |
| 70th row: 25 902 912 1137 2975 9642 11598 25919 28278 |
| 71st row: 420 976 1055 8473 11512 20198 21662 25443 30119 |
| 72nd row: 1 24 932 6426 11899 13217 13935 16548 29737 |
| 73rd row: 53 618 988 6280 7267 11676 13575 15532 25787 |
| 74th row: 111 739 809 8133 12717 12741 20253 20608 27850 |
| 75th row: 120 683 943 14496 15162 15440 18660 27543 32404 |
| 76th row: 600 754 1055 7873 9679 17351 27268 33508 |
| 77th row: 344 756 1054 7102 7193 22903 24720 27883 |
| 78th row: 582 1003 1046 11344 23756 27497 27977 32853 |
| 79th row: 28 429 509 11106 11767 12729 13100 31792 |
| 80th row: 131 555 907 5113 10259 10300 20580 23029 |
| 81st row: 406 915 977 12244 20259 26616 27899 32228 |
| 82nd row: 46 195 224 1229 4116 10263 13608 17830 |
| 83rd row: 19 819 953 7965 9998 13959 30580 30754 |
| 84th row: 164 1003 1032 12920 15975 16582 22624 27357 |
| 85th row: 8433 11894 13531 17675 25889 31384 |
| 86th row: 3166 3813 8596 10368 25104 29584 |
| 87th row: 2466 8241 12424 13376 24837 32711. |

* * * * *